(12) United States Patent
Hwang (10) Patent No.: US 8,845,810 B2
(45) Date of Patent: Sep. 30, 2014

(54) SUBSTRATE DAMAGE PREVENTION SYSTEM AND METHOD

(75) Inventor: Young Joo Hwang, Seoul (KR)

(73) Assignee: ADP Engineering Co., Ltd., Seongnam-Si, Gyeonggi-Do (KR)

( * ) Notice: Subject to any disclaimer, the term of this patent is extended or adjusted under 35 U.S.C. 154(b) by 1198 days.

(21) Appl. No.: 11/874,365

(22) Filed: Oct. 18, 2007

(65) Prior Publication Data

US 2008/0138535 A1     Jun. 12, 2008

(30) Foreign Application Priority Data

Dec. 11, 2006  (KR) .................. 10-2006-0125259

(51) Int. Cl.
| | |
|---|---|
| C23C 16/00 | (2006.01) |
| C23C 16/50 | (2006.01) |
| C23F 1/00 | (2006.01) |
| H01L 21/306 | (2006.01) |
| H01J 37/32 | (2006.01) |
| H01L 21/683 | (2006.01) |

(52) U.S. Cl.
CPC ....... *H01J 37/32788* (2013.01); *H01J 37/3244* (2013.01); *H01L 21/6831* (2013.01)
USPC ..................... 118/729; 156/345.54

(58) Field of Classification Search
CPC ............... H01J 37/00; H01J 37/32697; H01J 37/32706; H01J 37/32724; C23C 16/4586; C23C 14/51; C23C 14/541; C23C 16/48; C23C 16/50; C23C 16/463; C23C 16/466; H01L 21/683; H01L 21/6831; H01L 21/6833
USPC ................ 118/728, 729, 730, 731, 732; 156/345.51, 345.52, 345.53, 345.54, 156/345.55

See application file for complete search history.

(56) References Cited

U.S. PATENT DOCUMENTS

| | | | | |
|---|---|---|---|---|
| 5,093,579 | A | * | 3/1992 | Amemiya et al. ....... 250/453.11 |
| 5,192,849 | A | * | 3/1993 | Moslehi ................... 219/121.43 |
| 5,376,213 | A | * | 12/1994 | Ueda et al. ............... 156/345.27 |
| 5,542,559 | A | * | 8/1996 | Kawakami et al. ............. 216/67 |
| 5,622,593 | A | * | 4/1997 | Arasawa et al. ......... 156/345.27 |
| 5,790,365 | A | * | 8/1998 | Shel .............................. 361/234 |
| 6,236,555 | B1 | | 5/2001 | Leeser .......................... 361/234 |
| 6,320,736 | B1 | * | 11/2001 | Shamouilian et al. ........ 361/234 |
| 6,500,686 | B2 | * | 12/2002 | Katata et al. .................... 438/22 |
| 2001/0009178 | A1 | * | 7/2001 | Tamura et al. ................ 156/345 |

(Continued)

FOREIGN PATENT DOCUMENTS

| | | |
|---|---|---|
| JP | 07-326569 A | 12/1995 |
| KR | 20-1999-0039091 A | 11/1999 |
| KR | 10-2006-0033308 A | 4/2006 |

*Primary Examiner* — Maureen Gramaglia
*Assistant Examiner* — Tiffany Nuckols
(74) *Attorney, Agent, or Firm* — Ked & Associates, LLP (57) ABSTRACT

A substrate damage prevention system and method for a plasma treating apparatus are provided. The system may include a lower electrode on which a substrate may be mounted, an inert gas supply unit which may supply an inert gas to an upper surface of the lower electrode on which the substrate is mounted, and an air supply unit which may supply air to the upper surface of the lower electrode. An inert gas may be supplied between the lower electrode and the substrate in order to control the temperature of the substrate during the chucking. Air may be supplied between the lower electrode and the substrate during dechucking in order to allow the substrate to be easily separated from the lower electrode.

16 Claims, 6 Drawing Sheets

(56) References Cited

U.S. PATENT DOCUMENTS

2004/0099635 A1* 5/2004 Nishikawa ................. 216/58
2005/0039685 A1* 2/2005 Eiriksson et al. ............ 118/728
2005/0284577 A1* 12/2005 Kwon ..................... 156/345.51
2006/0046506 A1* 3/2006 Fukiage .................... 438/758

* cited by examiner

SUBSTRATE DAMAGE PREVENTION SYSTEM AND METHOD

This application claims the benefit of Korean Patent Application No. 10-2006-0125259 filed on Dec. 11, 2006, the entirety of which is incorporated herein by reference.

BACKGROUND

1. Field

This relates to a substrate damage prevention system and method, and more particularly to a substrate damage prevention system and method for use in a plasma treating apparatus.

2. Background

Flat panel display elements may include, for example, liquid crystal display (LCD) elements, plasma display panel (PDP) elements, organic electroluminescent (EL) display elements, and the like. Surface treatment of the substrates used to form these types of flat panel display elements may be done in a vacuum processing apparatus, including a load-lock chamber, a transfer chamber, and a processing chamber.

The load-lock chamber may alternately maintain an atmospheric condition and a vacuum condition, and may temporarily store both treated and untreated substrates. The transfer chamber may include a transfer robot which transfers substrates between chambers. Thus, the transfer robot may transfer substrates to be processed to a processing chamber from the load-lock chamber, and processed substrates from the process chamber to the load-lock chamber. The processing chamber forms a film on the substrate or etches a film on the substrate using plasma or heat energy in a vacuum therein. Physical and environmental conditions in the chamber should be controlled to ensure proper surface treatment of the substrates, and to prevent damage to the substrates before, during and after treatment.

BRIEF DESCRIPTION OF THE DRAWINGS

The embodiments will be described in detail with reference to the following drawings in which like reference numerals refer to like elements wherein.

DETAILED DESCRIPTION

Figure 1:
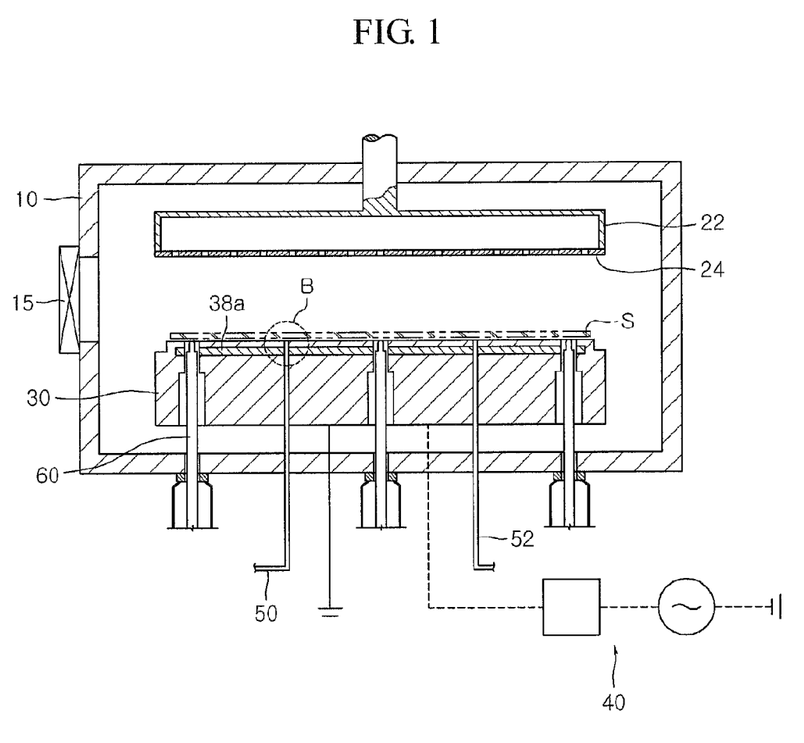
FIG. 1 is a sectional view of an exemplary plasma treating apparatus.

As shown in FIG. 1, a process chamber may include a chamber 10 having a gate 15 so that the inside of the chamber 10 may be switched to a vacuum state, an upper electrode 22 disposed in an upper portion of the inside of the chamber 10, and a lower electrode 30 disposed under the upper electrode 22 and having a surface on which a substrate S may be mounted.

The upper electrode 22 may include a shower head 24 which sprays a process gas onto the substrate S. The shower head 24 may have a plurality of diffusing holes, each having a relatively small diameter so as to uniformly process gas to a space provided between the electrodes 22 and 30. The gas may transition to a plasma state when high frequency power supplied by a radio frequency (RF) power device 40 is applied to the electrodes 22 and 30. The surface of the substrate S positioned on the lower electrode 30 may be treated by the plasma.

Figure 2A:
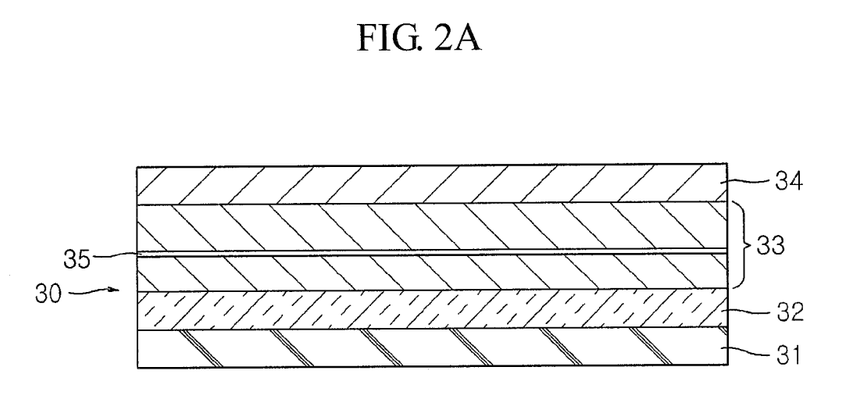
FIG. 2A is an enlarged sectional view of an exemplary lower electrode which may be used with the apparatus shown in FIG. 1.

The lower electrode 30 may include a base plate 31 at a lowermost part thereof, an insulating member 32 positioned on the base plate 31, a cooling plate 33 positioned on the insulating member 32, and a lower electrode portion 34 positioned on the cooling plate 33. The substrate S is placed on the lower electrode portion 34 for treatment. Accordingly, if the chamber 10 is heated during the treatment process, the substrate treatment may be affected by the temperature of the chamber 10. For this reason, the cooling plate 33 may be provided to cool down the lower electrode 30 in order to prevent the substrate S from being heated to a temperature which exceeds a predetermined temperature during the treatment process.

The cooling plate 33 may include a refrigerant circulation passage 35 that circulates refrigerant therethrough so as to prevent the lower electrode 30 from being heated to a temperature greater than or equal to the predetermined temperature. That is, the cooling plate 33 may maintain the lower electrode 30 at a substantially constant temperature.

When treating the substrate S using the upper electrode 22 and the lower electrode 30, process reliability may be improved by precisely situating the substrate S at a predetermined position and securely fixing the substrate S to the lower electrode 30. Fixing devices, such as, for example, a vacuum chuck (not shown), may be used to fix the substrate S to the lower electrode 30 using mechanical characteristics. However, if the vacuum chuck is used in a vacuum, there is essentially no pressure difference between the pressure created by the vacuum chuck and ambient pressure, and the vacuum chuck cannot effectively fix the substrate S to the lower electrode 30. Further, because the vacuum chuck depends on a local air intake for operation it cannot always accurately fix the substrate S in place on the lower electrode 30.

Figure 2B:
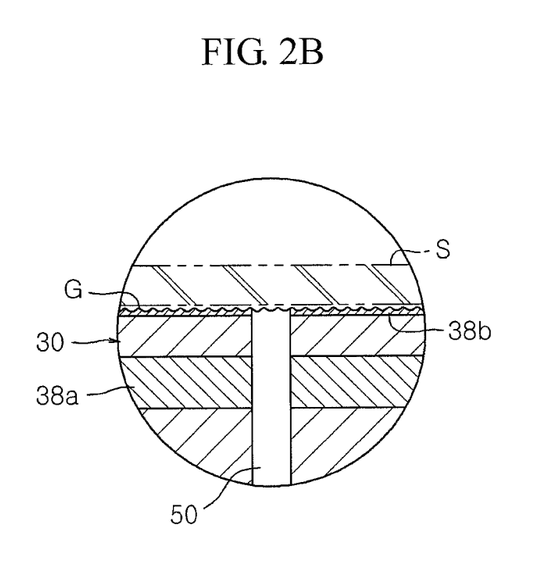
FIG. 2B is an enlarged sectional view of part B of FIG. 1.

An electrostatic chuck (ESC) may be used to fix an object, such as the substrate S, using electric characteristics, and in particular, a dielectric polarization phenomenon created by a potential difference and an electrostatic force principle. Accordingly, the electrostatic chuck may fix the substrate S to the lower electrode 30 without being influenced by a pressure difference. Thus, as shown in FIG. 2B, the lower electrode 30 may be provided with an electrostatic chuck electrode 38a connected to a direct current (DC) voltage bar to generate an electric field when a voltage is applied thereto. In this manner, the electrostatic chuck electrode 38a may tightly fix the substrate S to the lower electrode 30.

A helium passage panel 38b may be coupled to an upper surface of the lower electrode 30, and the substrate S may be placed on the upper surface of the helium passage panel 38b. The upper surface of the helium passage panel 38b may include groove patterns G, along which helium circulates. The groove patterns G may be connected to an inlet pipe 50 through which helium gas is introduced into the groove patterns G, and an outlet pipe 52 through which the helium gas is discharged.

The helium gas may circulate in a gap between the lower electrode 30 and the substrate S to help the cooling plate control the temperature of the substrate S. The helium gas may be introduced into the groove patterns G through the inlet pipe 50, may pass all the way through the groove patterns G, and may be discharged outside the lower electrode 30 through the outlet pipe 52, thereby promoting temperature control and enhanced heat conduction capability.

During a chucking operation to fix the substrate S to the lower electrode 30, the substrate S may be situated on the upper surface of the lower electrode 30, i.e. on the helium passage panel 38b. The substrate S may be placed on the helium passage panel 38b using lift pins 60, which move up and down, penetrating through the lower electrode 30 in the chamber 10. Next, a DC voltage may be applied to the electrostatic chuck electrode 38a so as to generate an electric field between the electrostatic chuck electrode 38a and the substrate S, and thus the substrate S is fixed to the lower electrode 30. At this time, a sealed gap is formed between the substrate S and the helium passage panel 38b, and then helium gas may be introduced into the sealed gap in order to maintain the substrate S at a constant temperature. Next, RF power may be supplied to the electrodes 22 and 30 and a process gas may be introduced between the electrodes 22 and 30 to perform plasma treatment.

After the plasma treatment is finished, the dechucking operation may be performed in the reverse order of the chucking operation. That is, first the supply of the RF power 40 and the process gas may be stopped, then the helium gas supply may be stopped, and finally the DC voltage supplied to the electrostatic chuck electrode 38a may be interrupted so as to release the electrostatic force. After the release of the electrostatic force, the substrate S may be lifted up using the lift pins 60, and then drawn outside the process chamber 10.

The electrostatic chuck electrode 38a provides for precise and reliable fixing of the substrate S on the lower electrode 30. However, it may take a long time to draw the substrate S out of the process chamber due to the long discharge period required to discharge charges from the substrate S. Further, it may be difficult to confirm that the charges have been completely discharged from the substrate S and that the substrate S has been completely dechucked.

Figure 3:
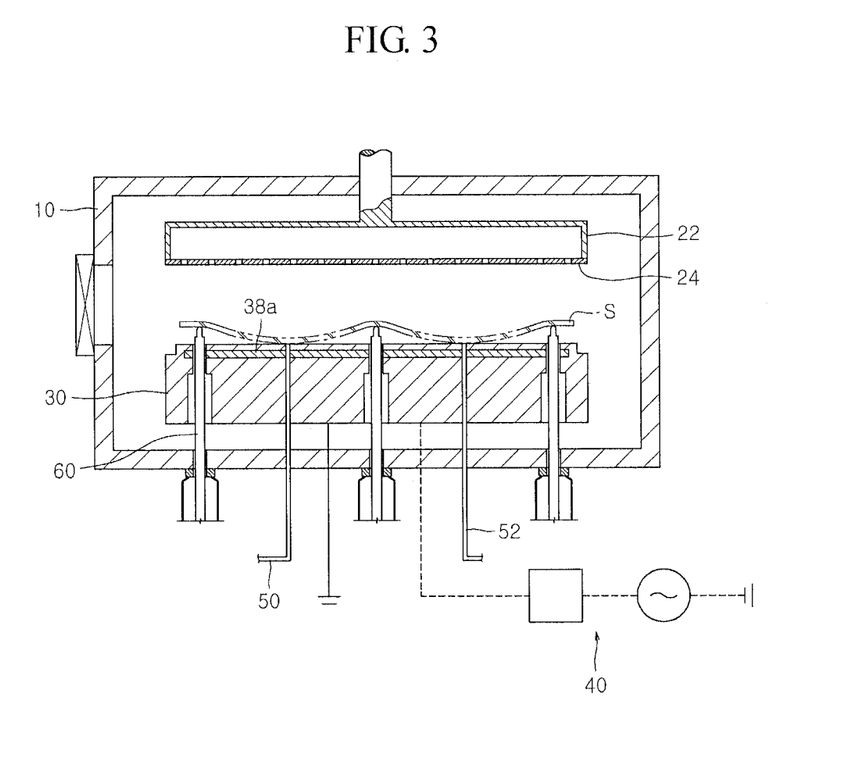
FIG. 3 is a sectional view of the exemplary plasma treating apparatus shown in FIG. 1 as a substrate is lifted.

If the substrate S is drawn out of the process chamber before the substrate S is not completely dechucked, as shown in FIG. 3, the substrate S may be bent when the substrate S is lifted by the lift pins 60, because some portions of the substrate S are subjected to an upward physical force applied to the substrate S by the lift pins 60 as they move the substrate S up toward the upper electrode 22. Conversely, some portions of the substrate may be subjected to a downward force due to residual electrostatic force that pulls the substrate S down toward the lower electrode 30. If the substrate S is seriously bent, circuit patterns formed on the substrate S may be damaged, and/or the substrate S may break. As display devices, such as, for example, liquid crystal display devices, become larger, so do the substrates used to fabricate these display devices. As the substrates become larger, the longer the time is that it takes to completely discharge charges from the substrates.

Figure 5:
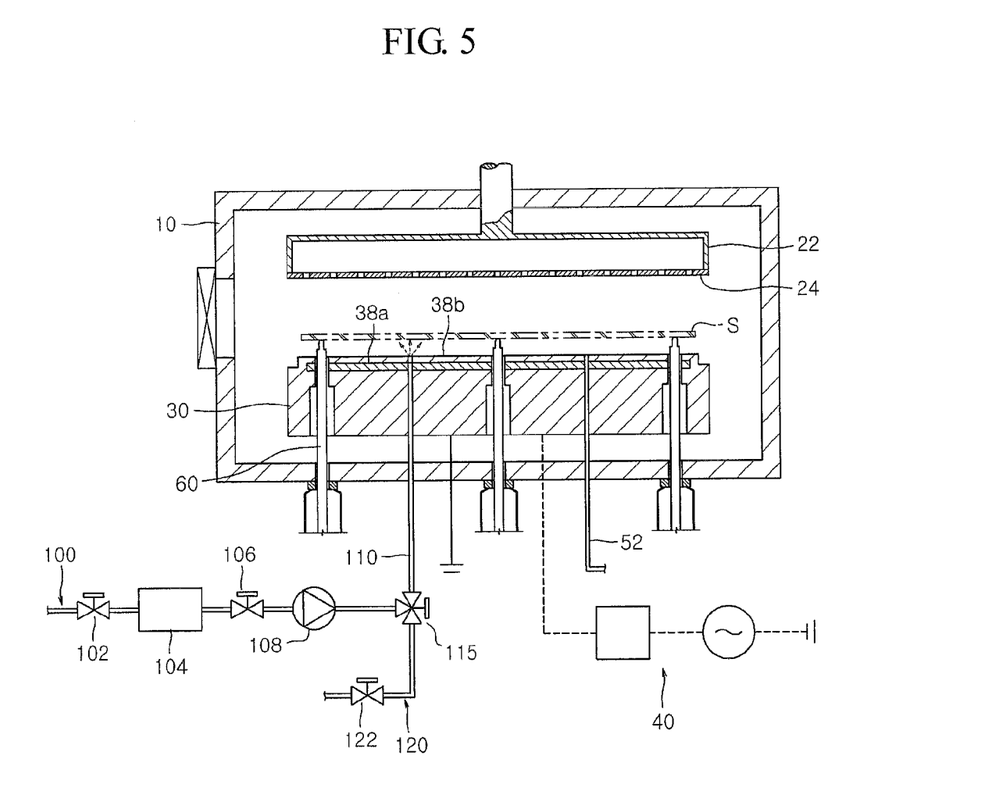
FIG. 5 is a sectional view of the plasma treating apparatus shown in FIG. 4 with a substrate in a lifted position.
Figure 6:
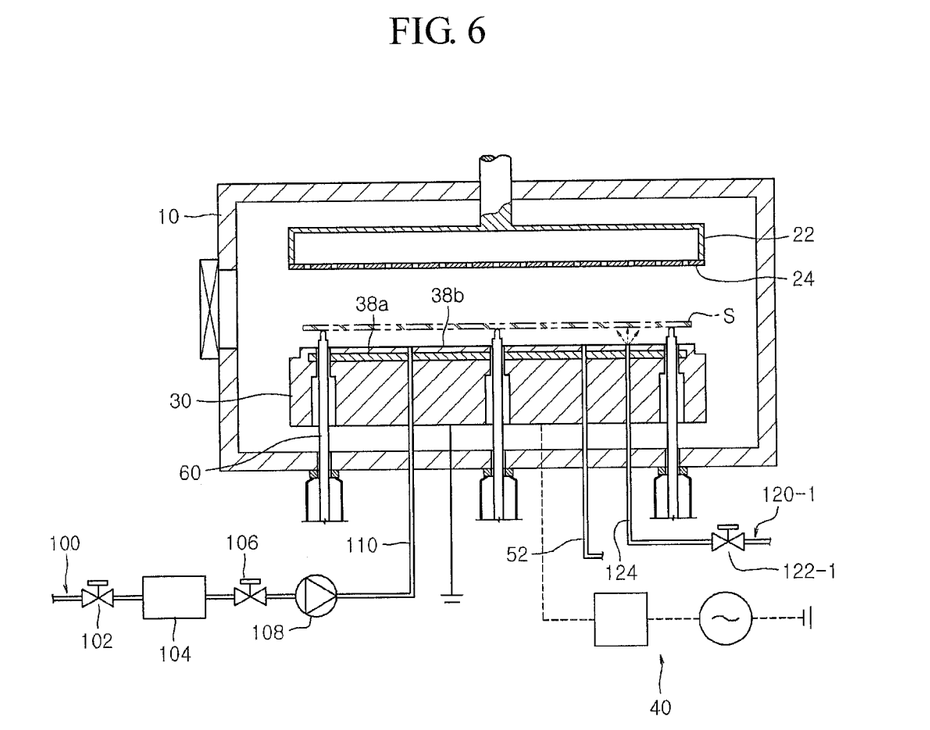
FIG. 6 is a sectional view of a plasma treating apparatus equipped with a substrate damage preventing device according to another embodiment as broadly described herein.

To address these bending/warping problems, the plasma treating apparatus shown in FIGS. 5 and 6 may include an inert gas supply unit 100 which supplies an inert gas to an inert gas passage panel 38b provided between a lower electrode 30 and a substrate S. The inert gas supply unit 100 may be sequentially connected to an inert gas tank (not shown) storing an inert gas therein, a first valve 102, a pressure adjusting portion 104, a second valve 106, and an inlet pipe 110 penetrating the lower electrode 30. The inert gas held in the tank and supplied through the supply unit 100 may be helium gas, or other inert gas as appropriate.

Figure 4:
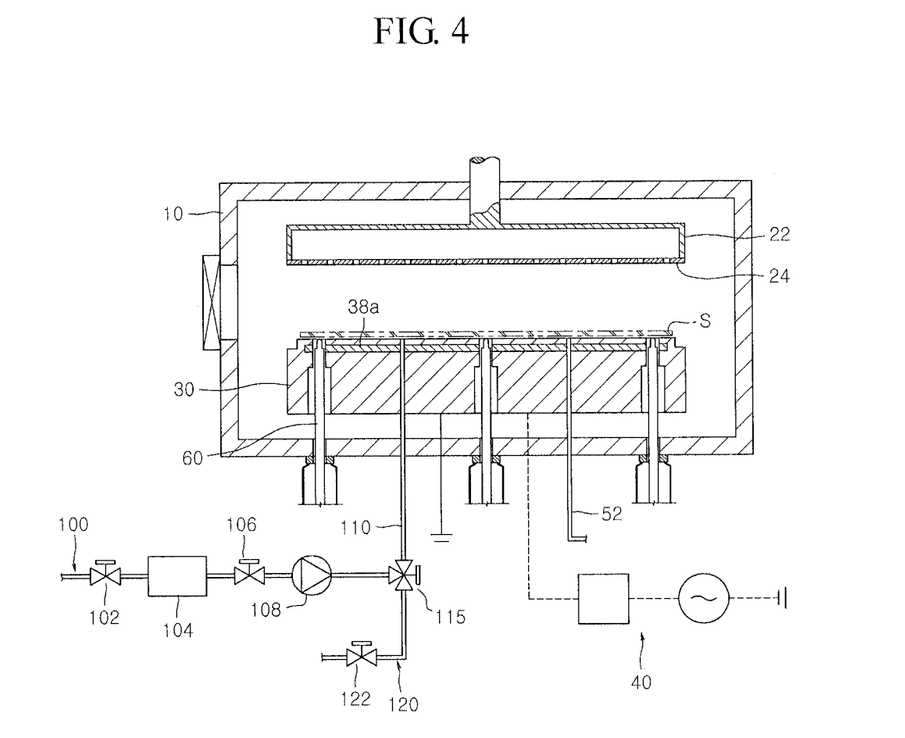
FIG. 4 is a sectional view of a plasma treating apparatus equipped with a substrate damage preventing device according to an embodiment as broadly described herein.

The inert gas (helium gas) supply unit 100 may be connected to an air supply unit 120 provided with an air supply control valve 122. The air supply control valve 122 may be connected to an air tank (not shown) and may open an air passage by being opened when the substrate S is dechucked, so that air may be supplied into the gap between the substrate S and the lower electrode 30 through the inlet pipe 110.

Chucking and dechucking operations will be described with reference to the helium supply unit 100 and the air supply unit 120. For the chucking operation, the substrate S may be placed on the upper surface of the lower electrode 30, i.e. on the helium passage panel 38b. In a process chamber, the substrate S may be placed on the helium passage panel 38b using lift pins 60 which move up and down, penetrating through the lower electrode 30. Next, the substrate S may be fixed to the lower electrode 30 by generating an electrostatic force between an electrostatic chuck electrode 38a and the substrate S by supplying DC power to the electrostatic chuck electrode 38a. At this time, the gap between the substrate S and the helium passage panel 38b is sealed, and helium gas may be introduced into the sealed gap through the inlet pipe 110, so that the substrate S is maintained at a constant temperature. Next, power may be supplied to the electrodes 22 and 30, and a process gas may be supplied to the process chamber to perform plasma treatment.

When the first valve 102 is opened to supply helium gas to the gap between the lower electrode 30 and the substrate S, helium gas stored in the helium tank flows at a predetermined pressure, sequentially passing through the pressure adjusting portion 104, the second valve 106, a check valve 108, and into the inlet pipe 110, where the gas finally reaches the gap between the lower electrode 30 and the substrate S. Helium gas supplied to the process chamber in this manner may assist a cooling plate in controlling a temperature of the substrate S. The helium gas may be discharged through an outlet pipe 52 after the completion of plasma treatment in the process chamber. In certain embodiments, the second valve 106 of the helium gas supply unit 100 may be automatically opened when DC power is supplied to the electrostatic chuck electrode 38a of the lower electrode 30, and may be automatically closed when the DC power supply to the electrostatic chuck electrode 38a of the lower electrode 30 is interrupted.

After completing the plasma treatment, the dechucking operation may be performed in the reverse order of the chucking operation. First, the supply of RF power and process gas may be stopped so as to eliminate the plasma. Next, the DC power supply to the electrostatic chuck electrode 38a may be stopped so as to release the electrostatic force, and the second valve 106 may be closed so as to stop the supply of helium gas to the process chamber. After the electrostatic force is extinguished, air may be introduced into the gap between the substrate S and the lower electrode 30 through the inlet pipe 110 while the substrate S is lifted using the lift pins 60.

If the substrate S is drawn out of the process chamber before the substrate is completely dechucked, as shown in FIG. 3, the substrate S may be significantly bent, causing damage to circuit patterns formed on the substrate S and/or breakage of the substrate S. Supplying air between the lower electrode 30 and the substrate S through the inlet pipe 110 during the dechucking operation allows the substrate S to be easily separated from the lower electrode 30 with the aid of air pressure. Accordingly, during the dechucking operation, the air supply control valve 122 of the air supply unit 120 may be opened, and the second valve 106 of the helium gas supply unit 100 may be closed. In certain embodiments, the air supply control valve 122 may be automatically opened for a predetermined period that it takes to lift up the substrate S using the lift pins 60 after the DC power supply to the electrostatic chuck electrode 38a of the lower electrode 30 is stopped.

A three-way valve 115 may be provided at a junction of an air passage and a helium passage, so that air and helium gas may be selectively supplied to the process chamber through the inlet pipe 110. During the chucking operation, the second valve 106 of the helium gas supply unit 100 may be opened, and the air supply control valve 122 of the air supply unit 120 may be closed. Conversely, during the dechucking operation, the second valve 106 of the helium gas supply unit 100 may be closed, and the air supply control valve 122 of the air supply unit 120 may be opened. At this time, the three-way valve 115 may shift the direction of gas flow according to the opening and closing motions of the second valve 106 and the air supply control valve 122.

A process chamber of a plasma treating apparatus provided with a substrate damage preventing device according to another embodiment is shown in FIG. 6. This embodiment may include a helium gas supply unit 100 provided separate from an air supply unit 120-1. An air inlet pipe 124 may be structured so as to communicate with the upper portion of the lower electrode 30, and an air supply control valve 122-1 may be installed along an air passage defined by the air inlet pipe 124. The air supply control valve 122-1 may be opened for a predetermined period when DC power supply to an electrostatic chuck electrode 38a is interrupted. Accordingly, a substrate S may be lifted from the upper surface of the lower electrode 30 without bending or warping, thus preventing damage to the circuits thereon and/or breakage of the substrate S.

A substrate damage preventing device and a substrate damage preventing method are provided which prevent a substrate from breaking or a circuit on the substrate from being damaged by supplying air between a lower electrode and the substrate in a process chamber, which leads to rapid separation of the lower electrode and the substrate when performing an operation of dechucking the substrate from the lower electrode.

A substrate damage preventing device of a plasma treating apparatus as embodied and broadly described herein a lower electrode on which a substrate is mounted, an inert gas supply unit supplying inert gas to an upper surface of the lower electrode, and an air supply unit supplying air to the upper surface of the lower electrode.

The inert gas supply unit may include an inlet pipe through which the inert gas may be supplied to a gap between the lower electrode and the substrate, and the air supply unit may be structured in a manner such that it is capable of supplying air to the gap between the lower electrode and the substrate.

A three-way valve may be installed at a junction of a passage of the inert gas supply unit and a passage of the air supply unit.

The air supply unit may include an air tank, which stores air therein, and an air supply control valve, which allows and blocks air flow from the air tank.

The inert gas supply unit may include an inert gas tank, which stores an inert gas therein, a first valve, which allows and blocks inert gas flow from the inert gas tank, a pressure adjusting portion which adjusts a pressure of the inert gas passing out of the first valve, a second valve which allows and blocks locks flow of the inert gas passing out of the pressure adjusting portion according to an input signal, and an inlet pipe, through which the inert gas passing out of the second valve is supplied to the upper surface of the lower electrode.

The first valve may be a manual valve and the second valve may be an automatic valve, which is opened and closed according to an electrical input signal.

The air supply unit may include an air tank, which stores the air therein, an air supply control valve, which allows and blocks the flow of air from the air tank, and an inlet pipe, through which the air is supplied to the upper surface of the lower electrode.

A substrate damage preventing method for use in a plasma treating apparatus, as embodied and broadly described herein, may include introducing an inert gas into a gap between a lower electrode and a substrate using an inert gas supply unit when the substrate is placed on the lower electrode and power is supplied to an electrostatic chuck electrode of the lower electrode, and introducing air into the gap between the lower electrode and the substrate using an air supply unit when power supplied to the electrostatic chuck electrode is interrupted and the substrate is lifted by a lifting unit.

An inert gas supply control valve of the inert gas supply unit, which allows and blocks the flow of an inert gas according to an input signal, may be automatically opened and closed according to a signal which is input or interrupted according to power supply and interruption to the electrostatic chuck electrode.

An air supply control valve of the air supply unit, which allows and blocks the flow of air according to an input signal, may be automatically opened and closed according to a signal which is input or interrupted according to DC power supply and interruption to the electrostatic chuck electrode. The air supply control valve may be opened only for a predetermined period, when the power supply to the electrostatic chuck electrode is stopped.

A substrate damage prevention system and method as embodied and broadly described herein may reduce or substantially eliminate the risk of a circuit pattern on the substrate being damaged or the substrate breaking, attributable to substrate bending, by allowing the substrate to be easily separated from the lower electrode using air pressure by introducing air between the substrate and the lower electrode when the substrate is introduced into a process chamber and is fixed to the lower electrode, and when the substrate is lifted by lift pins after the substrate is fixed to the lower electrode by DC power applied to the electrostatic chuck electrode and a process for treating the substrate is performed.

Any reference in this specification to "one embodiment," "an embodiment," "example embodiment," "certain embodiment," "alternative embodiment," etc., means that a particular feature, structure, or characteristic described in connection with the embodiment is included in at least one embodiment as broadly described herein. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A substrate handling device, comprising:
   an electrode positioned in a chamber and configured to receive a substrate for processing, the electrode comprising:
      a base layer;
      an insulation layer provided on the base layer;
      a cooling layer provided on the insulation layer; and
      a lower electrode portion provided on the cooling layer;
   a gas passage panel positioned on a top surface of the electrode, a top surface of the gas passage panel having a groove pattern formed therein, facing a bottom surface of a substrate received on the electrode;
   a plurality of lift pins that penetrate through the electrode such that upper ends of the plurality of lift pins are configured to contact the bottom surface of the substrate so as to support the substrate thereon, wherein the bottom surface of the substrate contacts only the upper ends of the plurality of lift pins;
   an inert gas supplier to selectively supply an inert gas to a gap formed between the groove pattern formed on the gas passage panel and the bottom surface of the substrate positioned only on the upper ends of the plurality of lift pins, wherein the gap is sealed by a chucking operation; and
   an air supplier to selectively supply air to the sealed gap formed during chucking between the gas passage panel and the bottom surface of the substrate, wherein the air supplied to the gap during a de-chucking operation applies a predetermined air pressure to the substrate to exert a force against the substrate for releasing the seal formed during the chucking operation and separating the substrate from the lower electrode.

2. The device of claim 1, wherein the inert gas supplier comprises an inlet pipe configured to selectively supply inert gas to the gap formed between the gas passage panel and the lower surface of the substrate positioned only on the upper ends of the plurality of lift pins based on a position of at least one valve provided with the inlet pipe.

3. The device of claim 2, wherein the air supplier is configured to selectively supply air to the gap formed between the gas passage panel and the lower surface of the substrate positioned only on the upper ends of the plurality of lift pins based on a position of the at least one valve provided with the inlet pipe.

4. The device of claim 2, wherein the inlet pipe penetrates through the electrode.

5. The device of claim 2, wherein the inert gas supplier further comprises:
   a first valve configured to regulate a flow of inert gas from an external inert gas source into an inert gas passage;
   a pressure adjustment device provided with the inert gas passage and configured to receive inert gas from the first valve and adjust a pressure thereof; and
   a second valve provided with the inert gas passage and configured to receive the pressure-adjusted inert gas from the pressure adjustment device and to regulate the flow of the pressure-adjusted inert gas from the inert gas passage into the inlet pipe.

6. The device of claim 5, wherein the air supplier comprises an air supply control valve provided with an air supply passage and configured to regulate a supply of air from an external air source into the inlet pipe.

7. The device of claim 6, further comprising a three way valve provided at a junction of the inert gas passage, the air passage and the inlet pipe, wherein the three-way valve is configured to selectively supply inert gas or air to the inlet pipe.

8. The device of claim 5, wherein the first valve is a manual valve, and the second valve is an automatic valve configured to open and close in response to an electronic input signal.

9. The device of claim 1, wherein the inert gas supplier comprises an inert gas inlet pipe configured to selectively supply inert gas to the gap formed between the gas passage panel and the lower surface of the substrate based on a position of a valve provided with the inert gas inlet pipe, and the air supplier comprises an air inlet pipe configured to selectively supply air to the gap.

10. The device of claim 1, wherein the electrode comprises:
    a lower electrode positioned in a lower portion of the chamber; and
    an upper electrode positioned in an upper portion of the chamber, above the lower electrode.

11. The device of claim 10, wherein the cooling layer comprises a cooling passage through which cooling fluid flows, wherein the cooling layer is configured to cool the lower electrode during a substrate treatment process.

12. The device of claim 1, wherein the inert gas is supplied to the sealed gap through a first passage and exits the sealed gap through a second passage, and wherein the inert gas travels from the first passage to the second passage to control the temperature of the substrate.

13. The device of claim 12, wherein the first passage and the second passage are located on opposing sides relative to the substrate.

14. The device of claim 1, wherein the inert gas helps to maintain the substrate at a substantially constant temperature during the period of time between the chucking operation and the de-chucking operation.

15. The device of claim 1, wherein an electrostatic force is applied to seal the gap between the upper surface of the electrode and the bottom surface of the substrate during the chucking operation.

16. The device of claim 1, wherein the groove pattern formed in the gas passage panel comprises a plurality of grooves that control movement of the inert gas through the sealed gap during the period of time between the chucking operation and the de-chucking operation.

* * * * *